US 9,413,402 B1

(12) United States Patent
Mayer et al.

(10) Patent No.: US 9,413,402 B1
(45) Date of Patent: Aug. 9, 2016

(54) DYNAMIC LOW IF INJECTION SIDE SELECTION

(71) Applicant: Intel IP Corporation, Santa Clara, CA (US)

(72) Inventors: Andreas Mayer, Gramastetten (AT); Ram Sunil Kanumalli, Linz (AT)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 14/750,640

(22) Filed: Jun. 25, 2015

(51) Int. Cl.
*H04L 27/06* (2006.01)
*H03D 1/04* (2006.01)
*H04B 1/12* (2006.01)
*H04B 1/00* (2006.01)

(52) U.S. Cl.
CPC .............. *H04B 1/12* (2013.01); *H04B 1/0007* (2013.01)

(58) Field of Classification Search
CPC ............. H03D 1/04; H03D 7/18; H04B 1/26; H04B 1/1027; H04B 2001/1045; H04B 1/1072
USPC .................................................. 375/346, 350
See application file for complete search history.

(56) References Cited

U.S. PATENT DOCUMENTS

| 8,351,551 | B2* | 1/2013 | Redfern | ................ | H04L 25/061 375/316 |
| 2007/0165748 | A1 | 7/2007 | Khlat et al. | | |
| 2014/0270019 | A1* | 9/2014 | Ly-Gagnon | .............. | H03D 1/04 375/346 |

FOREIGN PATENT DOCUMENTS

| WO | 00/11794 A1 | 3/2000 |
| WO | 00/11795 A1 | 3/2000 |

OTHER PUBLICATIONS

Henderson, et al. "Image-Reject and Single-Sideband Mixers." The Communications Edge, WJ Communications, Inc. 6 pages.
Niknejad. "Lecture 15: Introduction to Mixers." University of California, Berkeley, EECS 142 Lecture 15, pp. 1-22.
"Low IF Receiver." engpaper.com, pp. 1-4.
"Wireless Receiver Architectures." Mar. 5, 2015, Radio Geek, pp. 1-7.

* cited by examiner

*Primary Examiner* — David S Huang
(74) *Attorney, Agent, or Firm* — Eschweiler & Associates, LLC (57) ABSTRACT

A low IF receiver for operation at an intermediate frequency (IF), comprises an antenna port configured to receive a receive signal comprising a wanted RF signal at an RF frequency and a blocker RF signal at a mirror image frequency of the wanted RF signal with respect to a frequency of an local oscillator (LO) signal, from an antenna. Further, the low IF receiver comprises a first mixer component configured to down convert the wanted RF signal and the blocker RF signal to an intermediate frequency (IF) signal, based on the frequency of the LO signal, wherein the IF signal comprises a wanted IF signal at a first intermediate frequency and a blocker IF signal at a second intermediate frequency and a second mixer component configured to receive the IF signal, separate the IF signal into the wanted IF signal and the blocker IF signal, and provide the wanted IF signal at a first output thereof and the blocker IF signal at a second output thereof, based on a tuning signal. In addition, the low IF receiver comprises a power estimation component configured to receive the blocker IF signal, measure a power of the blocker IF signal and select the frequency of the LO signal to be applied to the first mixer component from a plurality of LO frequencies, based on the measured power of the blocker IF signal.

23 Claims, 5 Drawing Sheets

DYNAMIC LOW IF INJECTION SIDE SELECTION

FIELD

The present disclosure relates to low intermediate frequency (IF) receivers and, in particular to dynamic low IF injection side selection in low IF receivers.

BACKGROUND

In order to meet the ever-increasing demands for greater levels of integration with fewer off-chip components, radio receivers are increasingly moving to architectures such as low IF. A low-IF receiver down converts a desired spectrum directly from RF to some very low-IF (typically <few 10s of MHz). Low-IF receivers can be highly integrated, since filtering can be done on-chip while maintaining high performance. Further, low IF is a powerful measure to fight spurious emissions in LTE-CA/-A and DR-DSDS capable transceivers. In addition, the down converted spectrum is at a low enough frequency that it can be easily sampled by low-power analog-to-digital converters (ADC), and is thus also known as digital IF. The spectrum may then be converted to baseband using digital signal processing (DSP). In some cases, the down converted spectrum is in the same frequency range as the baseband. However, one feature of this type of receiver is that a blocker signal which is an unwanted signal at a mirror image frequency of the wanted signal frequency is always relatively close to the wanted signal and is often arranged to be one of the adjacent channels. As a result, separation of the wanted signal from the blocker signal by filtering at RF is impracticable.

One characteristic of a low IF receiver is that it relies on good internal matching in its quadrature architecture to achieve high levels of adjacent channel rejection. That is, if there is an imbalance in the amplitude and phase between the I and Q channels, an extremely strong signal at the mirror image frequency will cause interference to the desired signal in the IF, if the desired signal is too weak, for example, in reference sensitivity cases or high modulation schemes like 64 QA+. This means that in situations where the blocker channel (i.e., the adjacent channel) is large relative to the wanted channel, some of the interferer in the blocker channel can find its way into the wanted signal spectrum. This results in a degradation in bit error rates at the output of the demodulator.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

In one embodiment of the disclosure, a low IF receiver for operation at an intermediate frequency (IF), comprises an antenna port configured to receive a receive signal comprising a wanted RF signal at an RF frequency and a blocker RF signal at a mirror image frequency of the wanted RF signal with respect to a frequency of an local oscillator (LO) signal, from an antenna. The low IF receiver further comprises a first mixer component configured to down convert the wanted RF signal and the blocker RF signal to an intermediate frequency (IF) signal, based on the frequency of the LO signal, wherein the IF signal comprises a wanted IF signal at a first intermediate frequency and a blocker IF signal at a second intermediate frequency. Further, the low IF receiver comprises a second mixer component configured to receive the IF signal, separate the IF signal into the wanted IF signal and the blocker IF signal, and provide the wanted IF signal at a first output thereof and the blocker IF signal at a second output thereof, based on a tuning signal. In addition, the low IF receiver comprises a power estimation component configured to receive the blocker IF signal, measure a power of the blocker IF signal and select the frequency of the LO signal to be applied to the first mixer component from a plurality of LO frequencies, based on the measured power of the blocker IF signal.

In another embodiment of the disclosure, a method for dynamically adjusting the injection side in a Low IF receiver operating at an intermediate frequency comprises receiving a receive signal comprising a wanted RF signal at an RF frequency and a blocker RF signal at a mirror image frequency of the wanted RF signal with respect to a frequency of an local oscillator (LO) signal, and down converting the wanted RF signal and the blocker RF signal to an intermediate frequency (IF) signal, at a first mixer component, based on the frequency of the LO signal. The intermediate frequency signal comprises a wanted IF signal at a first intermediate frequency and a blocker IF signal at a second intermediate frequency. The method further comprises separating the wanted IF signal and the blocker IF signal from the IF signal at a second mixer component, based on a tuning signal. In addition, the method comprises estimating a power of the blocker IF signal at a power estimation component and selecting the frequency of the LO signal from a plurality of LO frequencies, based on the estimated power of the blocker IF signal.

In another embodiment of the disclosure, a computer program having a program code on a non-transitory medium for performing, when the computer program is executed on a computer or on a processor, a method for dynamically adjusting the injection side in a Low IF receiver is disclosed. The method comprises receiving a receive signal comprising a wanted RF signal at an RF frequency and a blocker RF signal at a mirror image frequency of the wanted RF signal with respect to a frequency of an local oscillator (LO) signal and down converting the wanted RF signal and the blocker RF signal to an intermediate frequency (IF) signal, at a first mixer component, based on the frequency of the LO signal, wherein the intermediate frequency signal comprises a wanted IF signal at a first intermediate frequency and a blocker IF signal at a second intermediate frequency. The method further comprises separating the wanted IF signal and the blocker IF signal from the IF signal at a second mixer component. In addition, the method comprises estimating a power of the blocker IF signal at a power estimation component; and selecting the frequency of the LO signal from a plurality of LO frequencies, based on the estimated power of the blocker IF signal.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "unit," "element," and the like are intended to refer to a computer-related entity, hardware, software (e.g., in execution), and/or firmware. For example, a component can be a processor, a process running on a processor, a controller, an object, an executable program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

As indicated above, low IF is a powerful measure to fight spurious emissions and blocker scenarios like NBB or ACS test cases defined in 36.101 for LTE-CA/-A and multi-sim applications. A well picked low IF can fully mitigate a spur, however, on the other hand low IF makes the receiver vulnerable to blockers by widening up the receiver sensitivity and due to the issue of image rejection. This disclosure presents a very efficient approach of tracking blockers at image frequencies and improving the receiver sensitivity. The disclosure also describes an effective method on how to pick the best suited LO frequency i.e., high band injection or low band injection.

In some implementations, the dynamic injection side selection in low IF receivers is achieved through a low IF receiver architecture already available for contiguous intra band reception. In intra band contiguous reception, for example, the receiver is configured to receive two aggregated downlink channels. The two downlink channels are then separated using digital down conversion using a digital front end. However, in cases where the receiver is used to avoid spurs using low IF, only a single downlink channel is used and half of the receive spectra remains unused i.e., only a part of the receive band is actively utilized for receiving the wanted signal. This provides a degree of freedom for selecting a sign of low IF or selecting a local oscillator (LO) frequency, to choose between high or low band injection. For example, in high band injection, the frequency of the LO signal, $f_{LO}$ is chosen to be greater than the frequency of the wanted signal $f_{RF}$ and in low band injection, the frequency of the LO signal, $f_{LO}$ is chosen to be lesser than the frequency of the wanted signal $f_{RF}$. In particular, in this disclosure, a low IF receiver having a second digital mixer that is readily available for contiguous intra band cases is used to down convert the blocker signals at image frequency in parallel with the wanted signal. Thereafter, based on the estimation of the received power of the blocker signals, $f_{LO}$ is changed from high band injection to low band injection, or vice versa.

In the following description, examples will be described and explained in more detail with respect to the dynamic injection side selection in low IF receivers. In particular, in one embodiment, a low IF receiver having a power estimation component configured to estimate a power of a blocker signal and thereby dynamically change the frequency of an LO signal, $f_{LO}$ is described.

Figure 1:
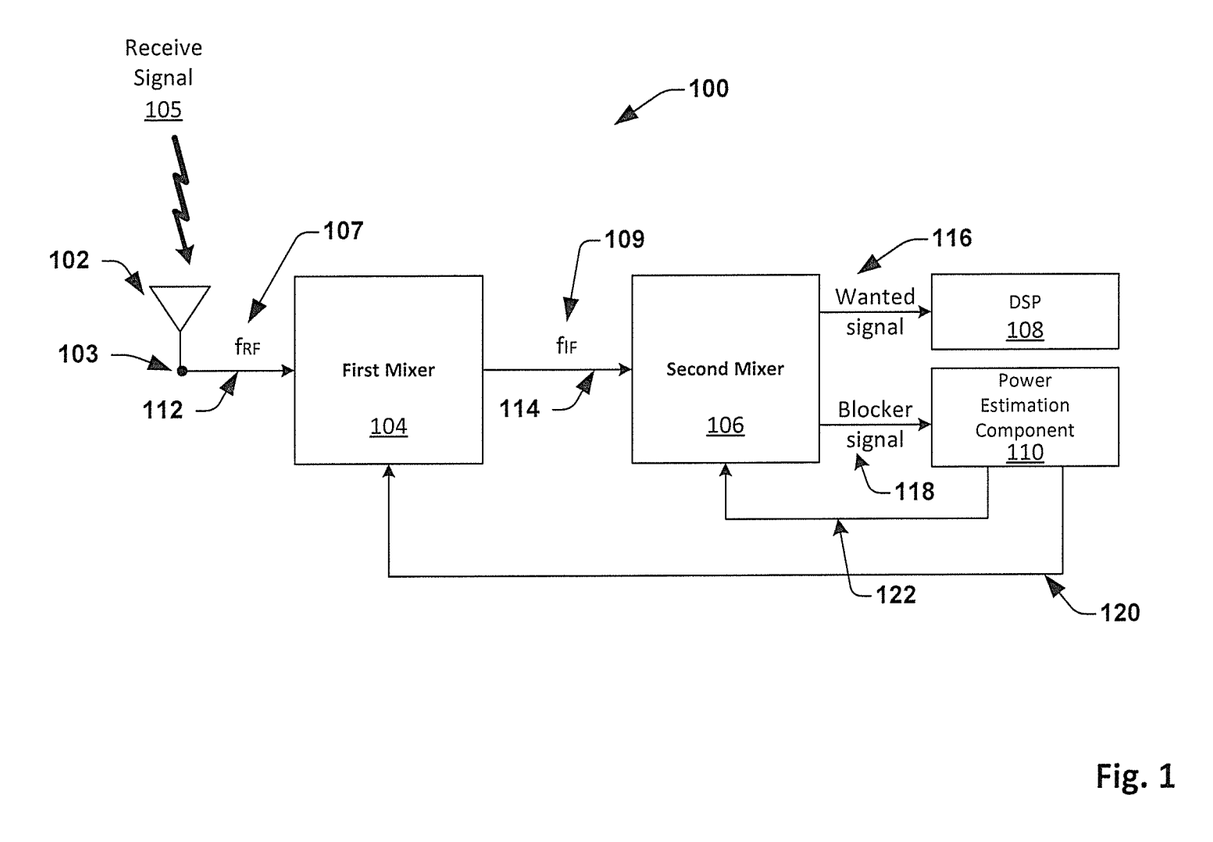
FIG. 1 shows a simplified block diagram of a low IF receiver, according to one embodiment of the disclosure.

FIG. 1 depicts an example embodiment of a low IF receiver 100 comprising an antenna port 103, a first mixer component 104, a second mixer component 106 and a power estimation component 110. The antenna port 103 is configured to receive a receive signal 105 at RF frequency $f_{RF}$ from the antenna 102. The receiver 100 further comprises a first signal path 112 configured to convey a receive signal $f_{RF}$ 107 from the antenna port 103 to the first mixer component 104. In some embodiments, the receive signal 105 and the receive signal 107 could be the same. However, in other embodiments, the receive signal 107 could be a processed/amplified version of the receive signal 105. Further, the receiver 100 comprises a second signal path 114 configured to convey an intermediate frequency (IF) signal 109 at IF frequency $f_{IF}$ from an output of the first mixer component 104 to the second mixer component 106.

The first mixer component 104 is located downstream of the antenna port 103 and is configured to down convert the receive signal 107 $f_{RF}$ to the intermediate frequency signal $f_{IF}$ 109 based on a local oscillator (LO) signal 120. In some embodiments, the receive signal 107 comprises a wanted RF signal at an RF frequency and a blocker RF signal at a mirror image frequency of the wanted RF signal with respect to a frequency of the local oscillator (LO) signal 120. Further, the IF signal 109 comprises a wanted IF signal generated by down converting the wanted RF signal and a blocker IF signal generated by down converting the blocker RF signal.

The second mixer component 106 is located downstream of the first mixer component 104 and is configured to receive the IF signal 109, and separate the IF signal 109 into the wanted signal 116 and the blocker signal 118. Further, the second mixer component 106 is configured to provide the wanted signal 116 from a first output thereof to a DSP 108 for further processing, and the blocker signal 118 from a second output thereof to the power estimation component 110. In some embodiments, the second mixer component 106 comprises a first IF mixer configured to tune the wanted IF signal and a second IF mixer configured to tune the blocker IF signal, from the IF signal 109.

The power estimation component 110 is located downstream of the second mixer component 106 and is configured to receive the blocker signal 118 from the second output of the second mixer component 106. The power estimation component 110 is further configured to estimate a power of the blocker signal 118 and generate a LO control signal configured to adjust the frequency of the LO signal 120 of the first mixer component 104 based on the estimated power of the blocker signal 118. In addition, the power estimation unit 110 is configured to generate a tuning signal 122 for tuning the second mixer component 106 based on the estimated power of the blocker IF signal 118. In some embodiments, the tuning signal 122 comprises a first tuning signal configured to tune the first IF mixer within the second mixer component 106 and a second tuning signal configured to tune the second IF mixer within the second mixer component 106.

Figure 2:
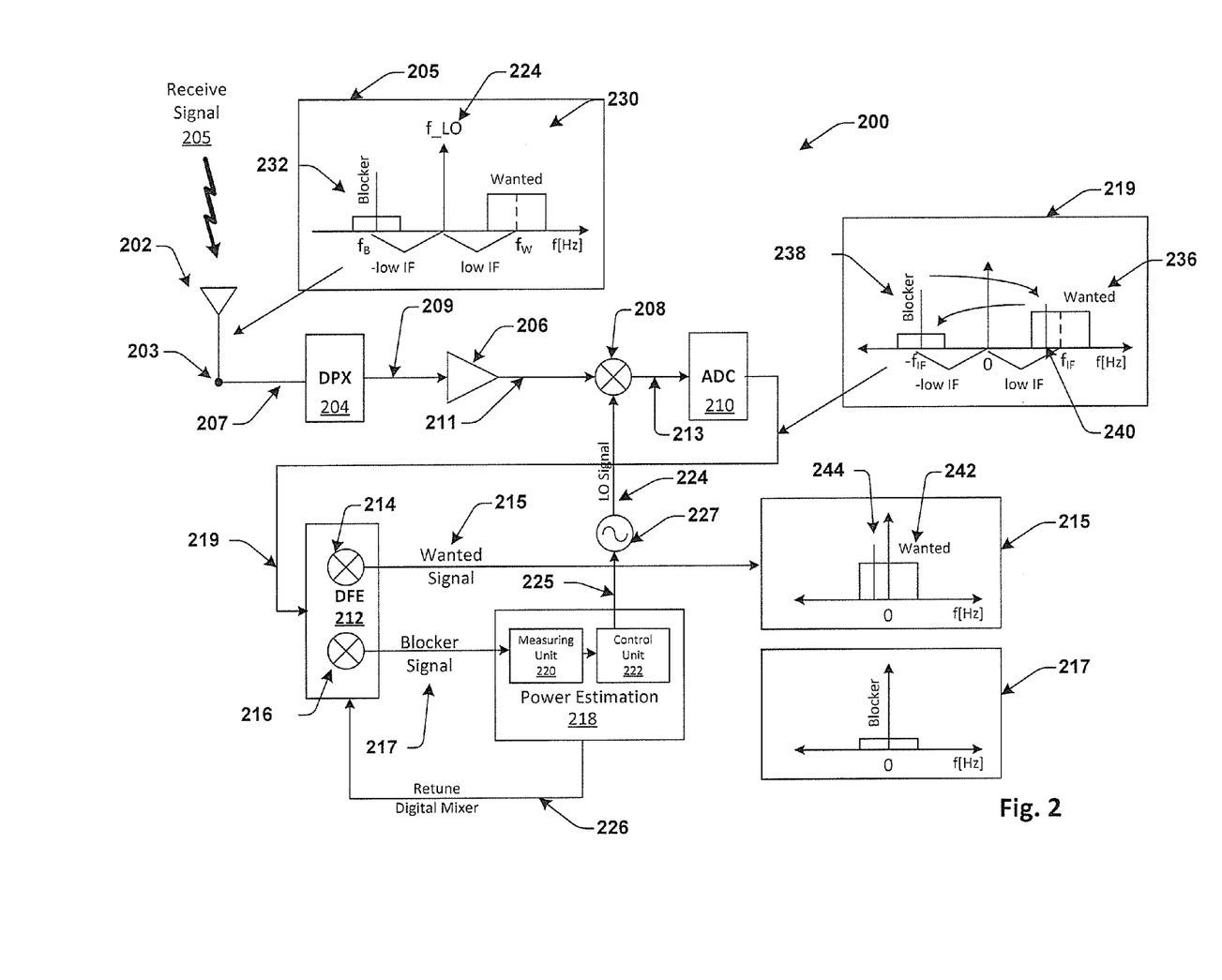
FIG. 2 shows a schematic diagram of an example implementation of a low IF receiver, according to another embodiment of the disclosure.

FIG. 2 depicts a particular embodiment of a low IF receiver 200 comprising an antenna port 203, a first mixer component 208, a second mixer component 212 and a power estimation component 218 for purposes of illustration. In some embodiments, the receiver 200 comprises a duplexer 204 and a power amplifier 206 between the antenna port 203 and the first mixer component 208. Further, the receiver 200 comprises an analog-to-digital converter (ADC) 210 between the first mixer component 208 and the second mixer component 214. The antenna port 203 is configured to receive a receive signal 205 from the antenna 202.

Figure 3A:
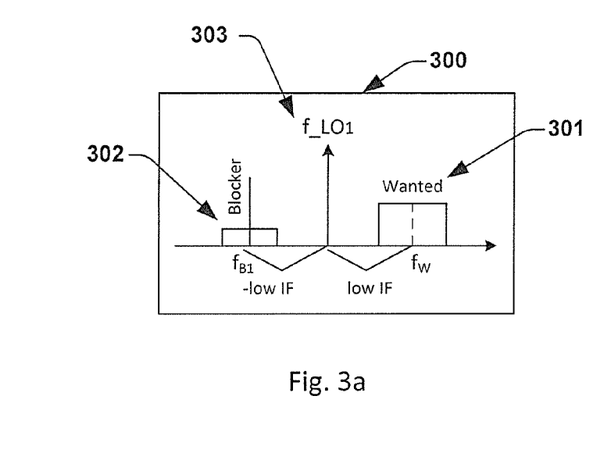
FIG. 3*a* shows a graph showing the frequency distribution at RF for low band injection.
Figure 3B:
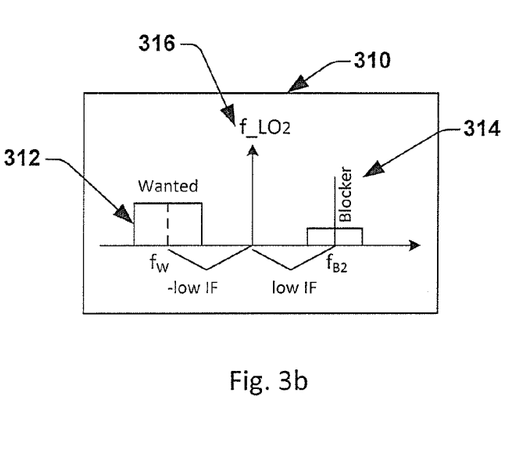
FIG. 3*b* shows a graph showing the frequency distribution at RF for high band injection.

The receive signal 205 comprises a wanted RF signal 230 at an RF frequency $f_W$ and a blocker RF signal 232 at a mirror image frequency $f_B$ of the wanted RF signal with respect to a frequency of a local oscillator (LO) signal $f_{LO}$ 224. In some embodiments, the receive signal 205 comprises a receive signal 300 as illustrated in FIG. 3a, wherein a frequency $f_{\_LO1}$ of an LO signal 303 is chosen to be lower than a frequency $f_W$ of a wanted signal 301 (i.e., low side injection). The frequency $f_{\_LO1}$ of the LO signal 303 could be chosen in the range of a bandwidth of the wanted signal 301 from the frequency $f_W$ of a wanted signal 301. Alternatively, the frequency $f_{\_LO1}$ of the LO signal 303 could be chosen in the range of a bandwidth divided by two of the wanted signal 301 from the frequency $f_W$ of a wanted signal 301. Therefore, in such embodiments, the receive signal 300 comprises a wanted RF signal 301 at an RF frequency $f_W$ and a blocker RF signal 302 at a mirror image frequency $f_{B1}$ of the wanted RF signal with respect to the LO signal 303, such that $f_{B1}<f_W$. In other embodiments, the receive signal 205 comprises a receive signal 310 as illustrated in FIG. 3b, wherein a frequency $f_{\_LO2}$ of an LO signal 316 is chosen to be higher than a frequency $f_W$ of a wanted signal 312 (i.e., high side injection). The frequency $f_{\_LO2}$ of an LO signal 316 could be chosen in the range of a bandwidth of the wanted signal 312 from the frequency $f_W$ of a wanted signal 312. Alternatively, the frequency $f_{\_LO2}$ of an LO signal 316 could be chosen in the range of a bandwidth divided by two of the wanted signal 312 from the frequency $f_W$ of a wanted signal 312. Therefore, in such embodiments, the receive signal 310 comprises a wanted RF signal 312 at an RF frequency $f_W$ and a blocker RF signal 314 at a mirror image frequency $f_{B2}$ of the wanted RF signal with respect to the LO signal 316, such that $f_{B2}>f_W$. The LO signal 224 or for example, the LO signals 303 and 316 are provided by the local oscillator 227 in FIG. 2. In some embodiments, the wanted RF signal 301 and the wanted RF signal 312 are the same.

Figure 4A:
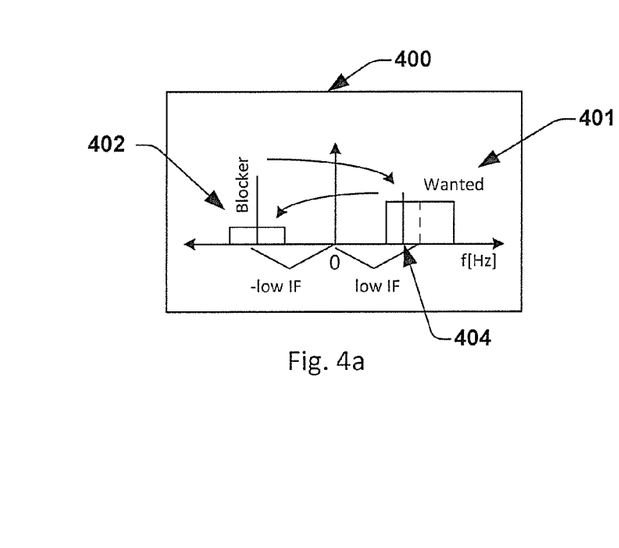
FIG. 4*a* shows a graph showing the frequency distribution at IF after down converting the RF signal in FIG. 3*a*.

The duplexer 204 is located downstream of the antenna port 203 and is configured to isolate the receive signal 205 from transmit signals. The resulting receive signal 209 is amplified by a power amplifier 206 located downstream of the duplexer 204 to generate an amplified receive signal 211. The receive signal 211 is an amplified version of the receive signal 205. The first mixer component 208 is located downstream of the power amplifier 206 and is configured to down convert the receive signal 211 to an intermediate frequency (IF) signal 213. The ADC 210 is located downstream of the first mixer component 208 and is configured to digitize the IF signal 213 to generate the digitized IF signal 219. The IF signal 219 comprises a wanted IF signal 236 at a frequency $f_{IF}$ generated by down converting the wanted RF signal 230 and a blocker IF signal 238 at a frequency $-f_{IF}$ generated by down converting the blocker RF signal 232. In some embodiments, the IF signal 219 comprises an IF signal 400 as illustrated in FIG. 4a, generated by down converting the receive signal 300 of FIG. 3a, based on the LO signal 303. The IF signal 400 comprises a wanted IF signal 401 at a frequency $f_{IF}$ generated by down converting the wanted RF signal 301, based in the LO signal 303 and a first blocker IF signal 402 at a frequency $-f_{IF}$ generated by down converting the blocker RF signal 302, based in the LO signal 303. The frequency of the wanted IF signal 401 and the first blocker IF signal 402 are derived as follows:

$$f_{IF}=f_W-f_{\_LO1} \quad (1)$$

$$-f_{IF}=f_{B1}-f_{LO1} \quad (2)$$

Figure 4B:
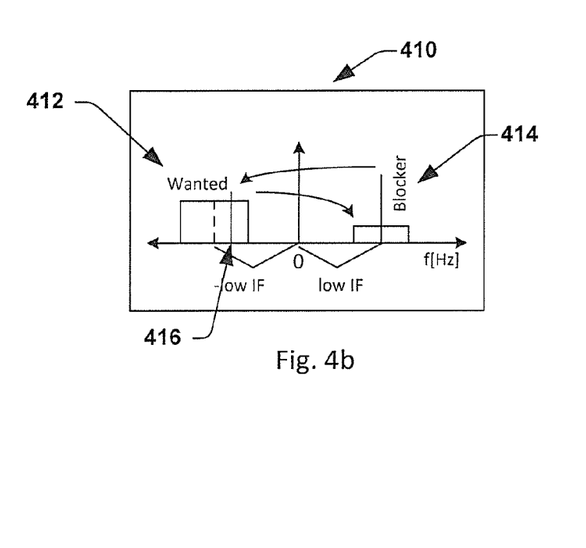
FIG. 4*b* shows a graph showing the frequency distribution at IF after down converting the RF signal in FIG. 3*b*.

In other embodiments, the IF signal 219 comprises an IF signal 410 as illustrated in FIG. 4b, generated by down converting the receive signal 310 of FIG. 3b, based on the LO signal 316. The IF signal 410 comprises a wanted IF signal 412 at a frequency $-f_{IF}$ generated by down converting the wanted RF signal 312, based in the LO signal 316 and a second blocker IF signal 414 at a frequency $f_{IF}$ generated by down converting the blocker RF signal 314, based on the LO signal 316. The frequency of the wanted IF signal 412 and the second blocker IF signal 414 are derived as follows:

$$-f_{IF}=f_W-f_{\_LO2} \quad (3)$$

$$f_{IF}=f_{B2}-f_{\_LO2} \quad (4)$$

In some embodiments, the first mixer component 208 in FIG. 2 comprises an I-Q demodulator. Due to the issue of I-Q imbalances in I-Q demodulators, in some instances, for example in the IF signal 219 illustrated in FIG. 2, an image signal 240 of the blocker IF signal 238 falls on the wanted IF signal 236, thereby causing distortion in the wanted IF signal

236. Further, referring to FIGS. 4a and 4b, in the IF signal 400, an image signal 404 of the first blocker IF signal 402 falls on the wanted IF signal 401 due to the I-Q imbalance, thereby causing distortion, and in the IF signal 410, an image signal 416 of the second blocker IF signal 414 falls on the wanted IF signal 412 due to the I-Q imbalance, thereby causing distortion.

The second mixer component 212 is located downstream of the ADC 210 and is configured to separate the wanted IF signal 236 and the blocker IF signal 238 from the IF signal 219. In some embodiments, the second mixer component 212 comprises a digital front end (DFE) comprising a first IF mixer 214 and a second IF mixer 216. The first IF mixer 214 is configured to tune the wanted IF signal 236 to generate the wanted signal 215 at a first output of the second mixer component 212 and the second IF mixer 216 is configured to tune the blocker IF signal 238 to generate the blocker signal 217 at a second output of the second mixer component 212. In one embodiment, the wanted signal 215 is extracted from the IF signal 219 by left shifting the wanted IF signal 236 to be centered around zero and then using low pass filter for filtering out unwanted signals. Similarly, the blocker signal 217 is extracted from the IF signal 219 by right shifting the blocker IF signal 238 to be centered around zero and then using high pass filter for filtering out unwanted signals. However, in other embodiments, for example, wherein the IF signal 219 comprises the IF signal 410 of FIG. 4b, the wanted signal 215 is extracted by right shifting the wanted IF signal 412 to be centered around zero and then using high pass filter for filtering out unwanted signals. Similarly, the blocker signal 217 is extracted by left shifting the blocker IF signal 414 to be centered around zero and then using low pass filter for filtering out unwanted signals. In some embodiments, the wanted signal 215 comprises a wanted portion 242 and an image of the blocker signal 244.

The power estimation unit 218 is located downstream of the second mixer component 212 and is configured to receive the blocker signal 217 from the second output of the second mixer component 212. The power estimation unit 218 is further configured to measure a power of the blocker signal 217 and generate an LO control signal 225 configured to tune the LO 227 to generate the LO signal 224 for the first mixer component 208. The LO signal 224 comprises a first LO signal $f_{\_LO1}$ 303 or a second LO signal $f_{\_LO2}$ 316 as illustrated in FIGS. 3a and 3b respectively, at different times based on the measured power of the blocker signal 217. Further, in some instances, the LO signal 224 comprises a third LO signal (not shown) having a frequency equal to the center frequency of the wanted RF signal $f_W$ 230. The LO control signal 225 tunes the LO 227 to generate the first LO signal $f_{\_LO1}$ 303 (i.e., low side injection) or the second LO signal $f_{\_LO2}$ 316 (i.e., high side injection) or the third LO signal based on the measured power of the blocker signal 217. Further, the power estimation unit 218 is configured to generate a tuning signal 226 for tuning the second mixer component 212. In some embodiments, the tuning signal 226 comprises a first tuning signal for tuning the first IF mixer 214 and a second tuning signal for tuning the second IF mixer 216.

In one embodiment, the power estimation unit 218 comprises a measuring unit 220 and a control unit 222. The measuring unit 220 is configured to measure a power or a measurement associated therewith of the blocker IF signal 217 and the control unit 222 is configured to generate the LO control signal 225 based on the measured power of the blocker IF signal 217. In some embodiments, the power estimation unit 218 is configured to operate in two phases, an analysis phase followed by a setup phase. In the analysis phase, the control unit 222 generates the LO control signal 225 and dynamically tunes the LO signal 224 to the first LO signal $f_{\_LO1}$ 303 in FIG. 3a and then to the second LO signal $f_{\_LO2}$ 316 in FIG. 3b. The measuring unit 220 then measures the power of the first blocker IF signal 402 in FIG. 4a generated based on the first LO signal $f_{\_LO1}$ 303 and the power of the second blocker IF signal 414 in FIG. 4b generated based on the second LO signal $f_{\_LO2}$ 316. Once the power of the first blocker IF signal 402 and the power of the second blocker IF signal 414 are measured, the power estimation unit 218 enters the setup phase, wherein a comparison of the measured powers is performed at the control unit 222. The control unit 222 then generates the LO control signal 225 and sets the LO signal 224 to the first LO signal $f_{\_LO1}$ 303 or the second LO signal $f_{\_LO2}$ 316 or the third LO signal based on the comparison of the powers measured during the analysis phase. For example, when the power of the first blocker IF signal 402 is greater than the power of the second blocker IF signal 414, the LO signal 224 is set to the second LO signal $f_{\_LO2}$ 316. In such instances, the image of the second blocker IF signal 414 (having lower power) falls on the wanted signal 215, thereby reducing distortion. Similarly, when the power of the second blocker IF signal 414 is greater than the power of the first blocker IF signal 402, the LO signal 224 is set to the first LO signal $f_{\_LO1}$ 303. In such instances, the image of the first blocker IF signal 402 (having lower power) falls on the wanted signal 215, thereby reducing distortion. Further, in some embodiments, when both the first blocker IF signal 402 and the second blocker IF signal 414 are strong (for example, exceeding a predetermined threshold), the LO signal 224 is set to the third LO signal. Once the LO signal 224 is set, the power estimation unit 218 is configured to re-enter the analysis phase at predetermined intervals.

Figure 5:
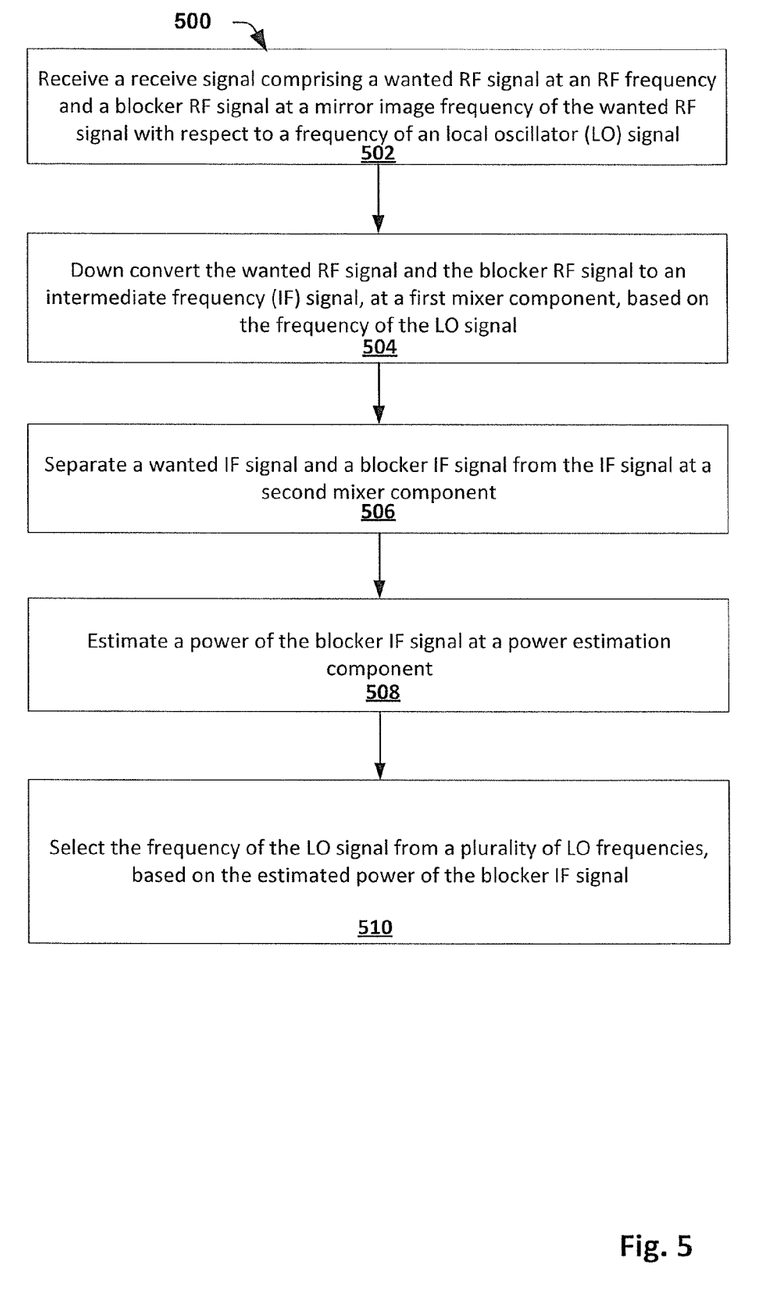
FIG. 5 shows a flowchart of a method for dynamically changing the injection side in a low IF receiver, according to one embodiment of the disclosure.

FIG. 5 shows a flowchart of a method for dynamically adjusting the injection side in a low IF receiver, according to one embodiment of the disclosure. The method 500 is described herein with respect to the low IF receiver 200 in FIG. 2, and the signals 300, 310, 400 and 410 in FIGS. 3a, 3b, 4a and 4b respectively. At 502, the signal 205 comprising the wanted RF signal 230 and the blocker RF signal 232 at a mirror image frequency of the wanted RF signal 230 with respect to the local oscillator signal 224 is received at the antenna port 203. At 504, the wanted RF signal 230 is down converted to the wanted IF signal 236 and the blocker RF signal 232 is down converted to the blocker IF signal 238 to form the IF signal 219 at the first mixer component 208, based on the LO signal 224. At 506, the wanted IF signal 236 and the blocker IF signal 238 are separated at the second mixer component 212, thereby generating the wanted signal 215 at a first output thereof and the blocker signal 217 at a second output thereof. At 508, a power of the blocker signal 217 is estimated at the power estimation unit 218. At 510, the LO signal 224 is set to the first LO signal $f_{\_LO1}$ 303 or the second LO signal $f_{\_LO2}$ 316 or a third LO signal corresponding to the center frequency of the wanted RF signal (not shown), based on the estimated power of the blocker signal 217.

Figure 6:
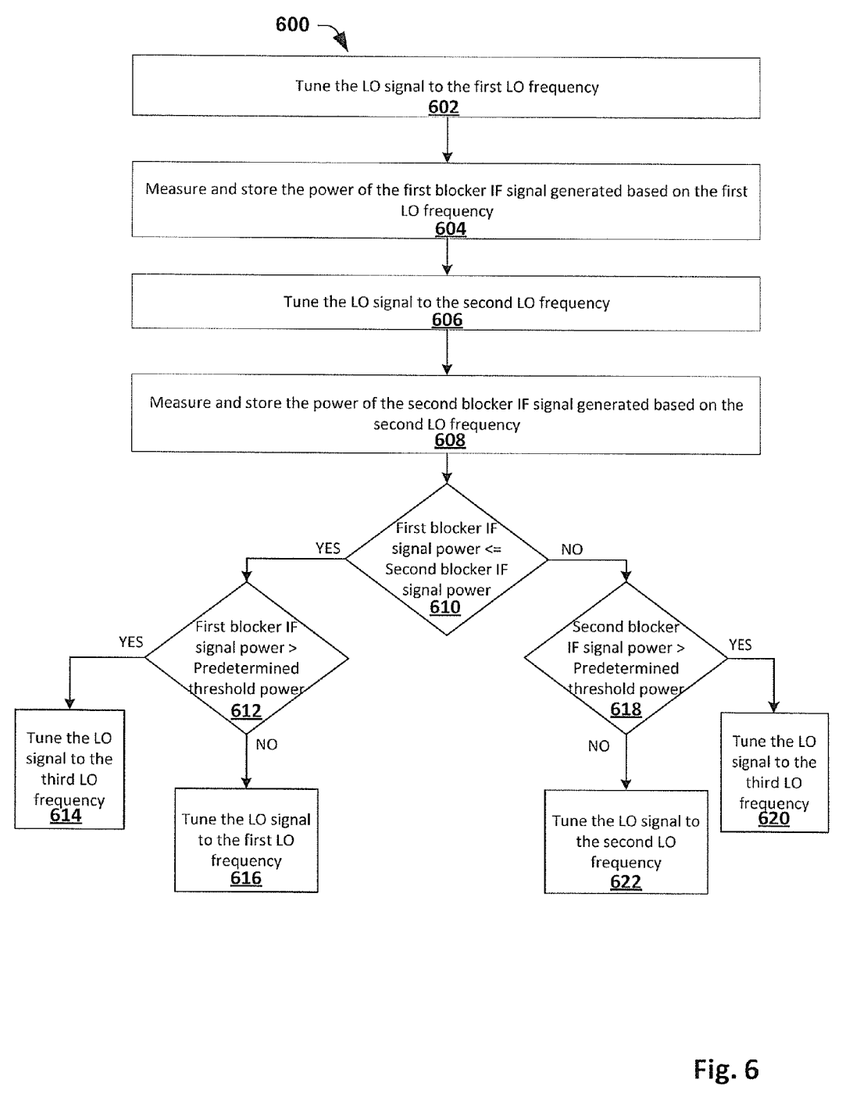
FIG. 6 shows an example implementation of the algorithm for choosing the best suited LO frequency, according to one embodiment of the disclosure.

FIG. 6 shows an example implementation of the algorithm for estimating the power of the blocker IF signal in block 508 of FIG. 5 and selecting the frequency of the LO signal in block 510 of FIG. 5. The algorithm 600 is described herein with respect to the low IF receiver 200 in FIG. 2, and the signals 300, 310, 400 and 410 in FIGS. 3a, 3b, 4a and 4b respectively. At 602, the control unit 222 in FIG. 2 generates the LO control signal 225 and dynamically tunes the LO signal 224 to the first LO signal $f_{\_LO1}$ 303 in FIG. 3a. At 604, the measuring unit 220 measures and stores the power of the first blocker IF signal 402 in FIG. 4a generated based on the first LO signal f_{LO1} 303. At 606, the control unit 222 dynamically tunes the LO signal 224 to the second LO signal f_{LO2} 316 in FIG. 3b. At 608, the measuring unit 220 measures and stores the power of the second blocker IF signal 414 in FIG. 4b generated based on the second LO signal f_{LO2} 316. At 610, a comparison is done to determine if the power of the first blocker IF signal 402 is less than or equal to the power of the second blocker IF signal 414. If yes, the method proceeds to 612 and if No, the method proceeds to 618. At 612, a comparison is done to determine if the power of the first blocker IF signal 402 is greater than a predetermined threshold power. If No, the method proceeds to 616, where the LO signal 224 is tuned to the first LO signal f_{LO1} 303 and if Yes, the method proceeds to 614, where the LO signal 224 is tuned to the third LO signal corresponding to the center frequency of the wanted RF signal (not shown). At 618, a comparison is done to determine if the power of the second blocker IF signal 414 is greater than a predetermined threshold power. If No, the method proceeds to 622, where the LO signal 224 is tuned to the second LO signal f_{LO2} 316 and if Yes, the method proceeds to 620, where the LO signal 224 is tuned to the third LO signal corresponding to the center frequency of the wanted RF signal (not shown).

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a low IF receiver for operation at an intermediate frequency (IF), comprising: an antenna port configured to receive a receive signal comprising a wanted RF signal at an RF frequency and a blocker RF signal at a mirror image frequency of the wanted RF signal with respect to a frequency of an local oscillator (LO) signal, from an antenna; a first mixer component configured to down convert the wanted RF signal and the blocker RF signal to an intermediate frequency (IF) signal, based on the frequency of the LO signal, wherein the IF signal comprises a wanted IF signal at a first intermediate frequency and a blocker IF signal at a second intermediate frequency; a second mixer component configured to receive the IF signal, separate the IF signal into the wanted IF signal and the blocker IF signal, and provide the wanted IF signal at a first output thereof and the blocker IF signal at a second output thereof, based on a tuning signal; and a power estimation component configured to receive the blocker IF signal, measure a power of the blocker IF signal and select the frequency of the LO signal from a plurality of LO frequencies, based on the measured power of the blocker IF signal.

Example 2 is a receiver including the subject matter of example 1, wherein the plurality of LO frequencies comprises: a first LO frequency comprising a frequency less than the wanted RF signal, at a difference of the intermediate frequency from center frequency of the wanted RF signal; a second LO frequency comprising a frequency greater than the wanted RF signal, at a difference of the intermediate frequency from center frequency of the wanted RF signal; and a third LO frequency comprising a frequency equal to the center frequency of the wanted RF signal.

Example 3 is a receiver including the subject matter of examples 1-2, including or omitting elements, wherein the blocker RF signal comprises a first blocker RF signal at a first mirror image frequency of the wanted RF signal based on the first LO frequency and a second blocker RF signal at a second image frequency of the wanted RF signal based on the second LO frequency.

Example 4 is a receiver including the subject matter of examples 1-3, including or omitting elements, wherein the blocker IF signal comprises a first blocker IF signal generated by down converting the first blocker RF signal based on the first LO frequency and a second blocker IF signal generated by down converting the second blocker RF signal based on the second LO frequency.

Example 5 is a receiver including the subject matter of examples 1-4, including or omitting elements, wherein the power estimation component comprises: a measuring unit configured to measure a power of the first blocker IF signal and the second blocker IF signal; and a control unit configured to generate an LO tuning signal configured to tune the frequency of the LO signal.

Example 6 is a receiver including the subject matter of examples 1-5, including or omitting elements, wherein power estimation component is configured to operate in an analysis phase, wherein the control unit dynamically tunes the frequency of the LO signal to the first LO frequency and the second LO frequency, and the measuring unit measures the power of the first blocker IF signal generated based on the first LO frequency and the second blocker IF signal generated based on the second LO frequency, respectively.

Example 7 is a receiver including the subject matter of examples 1-6, including or omitting elements, wherein power estimation component is further configured to operate in a setup phase, wherein the control unit generates an LO tuning signal configured to tune the frequency of the LO signal to the first LO frequency, the second LO frequency or the third LO frequency, based on a comparison of the measured power of the first blocker IF signal and the second blocker IF signal, measured during the analysis phase.

Example 8 is a receiver including the subject matter of examples 1-7, including or omitting elements, wherein both the first intermediate frequency and the second intermediate frequency are equal to the intermediate frequency and wherein the second intermediate frequency is a mirror image of the first intermediate frequency with respect to zero.

Example 9 is a receiver including the subject matter of examples 1-8, including or omitting elements, further comprising an analog to digital converter (ADC) downstream of the first mixer component configured to digitize the IF signal, prior to providing the IF signal to the second mixer component.

Example 10 is a receiver including the subject matter of examples 1-9, including or omitting elements, wherein the second mixer component further comprises a first mixer configured to tune the wanted IF signal and a second mixer configured to tune the blocker IF signal.

Example 11 is a receiver including the subject matter of examples 1-10, including or omitting elements, wherein the power estimation component is further configured to provide the tuning signal comprising a first tuning signal to tune the first mixer and a second tuning signal to tune the second mixer component.

Example 12 is a receiver including the subject matter of examples 1-11, including or omitting elements, wherein the power estimation component is further configured to dynamically adjust the first tuning signal and the second tuning signal based on the measured power of the blocker IF signal.

Example 13 is a receiver including the subject matter of examples 1-12, including or omitting elements, wherein the first mixer component comprises a first input configured to receive the wanted RF signal and the blocker RF signal, a second input configured to receive the LO signal and an output configured to generate the IF signal based on the wanted RF signal, the blocker RF signal and the LO signal.

Example 14 is a receiver including the subject matter of examples 1-13, including or omitting elements, wherein the power estimation component is configured to perform the measurement of the power of the blocker IF signal at predetermined intervals.

Example 15 is a receiver including the subject matter of examples 1-14, including or omitting elements, wherein the frequency of the LO signal is in the range of bandwidth divided by two of the wanted RF signal from the frequency of the wanted RF signal.

Example 16 is a receiver including the subject matter of examples 1-15, including or omitting elements, wherein the first mixer component comprises an I-Q demodulator.

Example 17 is a method for dynamically adjusting the injection side in a Low IF receiver operating at an intermediate frequency, comprising: receiving a receive signal comprising a wanted RF signal at an RF frequency and a blocker RF signal at a mirror image frequency of the wanted RF signal with respect to a frequency of an local oscillator (LO) signal; down converting the wanted RF signal and the blocker RF signal to an intermediate frequency (IF) signal, at a first mixer component, based on the frequency of the LO signal, wherein the intermediate frequency signal comprises a wanted IF signal at a first intermediate frequency and a blocker IF signal at a second intermediate frequency; separating the wanted IF signal and the blocker IF signal from the IF signal at a second mixer component, based on a tuning signal; estimating a power of the blocker IF signal at a power estimation component; and selecting the frequency of the LO signal from a plurality of LO frequencies, based on the estimated power of the blocker IF signal.

Example 18 is a method including the subject matter of example 17, wherein estimating the power of the blocker IF signal comprises: estimating the power of a first blocker IF signal generated based on the first LO frequency and a second blocker signal generated based on the second LO frequency; and comparing the power of the first blocker IF signal and the second blocker IF signal; wherein the first offset frequency comprises a frequency less than the frequency of the wanted RF signal, at a difference of the intermediate frequency from the wanted RF signal and the second offset frequency comprises a frequency greater than the frequency of the wanted RF signal, at a difference of the intermediate frequency from the wanted RF signal.

Example 19 is a method including the subject matter of examples 17-18, including or omitting elements, wherein selecting the frequency of the LO signal from a plurality of LO frequencies comprises tuning the frequency of the LO signal to the first LO frequency when the estimated power of the first blocker IF signal is weaker than the estimated power of the second blocker IF signal, and tuning the frequency of the LO signal to the second LO frequency when the estimated power of the second blocker IF signal is weaker than the estimated power of the first blocker IF signal.

Example 20 is a method including the subject matter of examples 17-19, including or omitting elements, wherein selecting the frequency of the LO signal from a plurality of LO frequencies, further comprises tuning the frequency of the LO signal to a third LO frequency when the estimated power of both the first blocker IF signal and the second blocker IF signal are greater than a predetermined threshold power, wherein the third LO frequency comprises a frequency equal to the center frequency of the wanted RF signal.

Example 21 is a method including the subject matter of examples 17-20, including or omitting elements, wherein the tuning signal for separating the wanted IF signal and the blocker IF signal from the IF signal is generated based on the estimated power of the blocker IF signal at the power estimation component.

Example 22 is a method including the subject matter of examples 17-21, including or omitting elements, wherein estimating the power of the blocker signal is performed at predetermined intervals.

Example 23 is a computer program having a program code on a non-transitory medium for performing, when the computer program is executed on a computer or on a processor, a method for dynamically adjusting the injection side in a Low IF receiver, comprising: receiving a receive signal comprising a wanted RF signal at an RF frequency and a blocker RF signal at a mirror image frequency of the wanted RF signal with respect to a frequency of an local oscillator (LO) signal; down converting the wanted RF signal and the blocker RF signal to an intermediate frequency (IF) signal, at a first mixer component, based on the frequency of the LO signal, wherein the intermediate frequency signal comprises a wanted IF signal at a first intermediate frequency and a blocker IF signal at a second intermediate frequency; separating the wanted IF signal and the blocker IF signal from the IF signal at a second mixer component; estimating a power of the blocker IF signal at a power estimation component; and selecting the frequency of the LO signal from a plurality of LO frequencies, based on the estimated power of the blocker IF signal.

Example 24 is a computer program having a program code on a non-transitory medium for performing, when the computer program is executed on a computer or on a processor, the method of any of the examples 17-22, including or omitting elements.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. A low IF receiver for operation at an intermediate frequency (IF), comprising:
   an antenna port configured to receive a receive signal comprising a wanted RF signal at an RF frequency and a blocker RF signal at a mirror image frequency of the wanted RF signal with respect to a frequency of an local oscillator (LO) signal, from an antenna;
   a first mixer component configured to down convert the wanted RF signal and the blocker RF signal to an intermediate frequency (IF) signal, based on the frequency of the LO signal, wherein the IF signal comprises a wanted IF signal at a first intermediate frequency and a blocker IF signal at a second intermediate frequency;
   a second mixer component configured to receive the IF signal, separate the IF signal into the wanted IF signal and the blocker IF signal, and provide the wanted IF signal at a first output thereof and the blocker IF signal at a second output thereof, based on a tuning signal; and
   a power estimation component configured to receive the blocker IF signal, measure a power of the blocker IF signal and select the frequency of the LO signal from a plurality of LO frequencies, based on the measured power of the blocker IF signal.

2. The receiver of claim 1, wherein the plurality of LO frequencies comprises:
   a first LO frequency comprising a frequency less than the wanted RF signal, at a difference of the intermediate frequency from center frequency of the wanted RF signal;
   a second LO frequency comprising a frequency greater than the wanted RF signal, at a difference of the intermediate frequency from center frequency of the wanted RF signal; and
   a third LO frequency comprising a frequency equal to the center frequency of the wanted RF signal.

3. The receiver of claim 2, wherein the blocker RF signal comprises a first blocker RF signal at a first mirror image frequency of the wanted RF signal based on the first LO frequency and a second blocker RF signal at a second image frequency of the wanted RF signal based on the second LO frequency.

4. The receiver of claim 3, wherein the blocker IF signal comprises a first blocker IF signal generated by down converting the first blocker RF signal based on the first LO frequency and a second blocker IF signal generated by down converting the second blocker RF signal based on the second LO frequency.

5. The receiver of claim 4, wherein the power estimation component comprises:
   a measuring unit configured to measure a power of the first blocker IF signal and the second blocker IF signal; and
   a control unit configured to generate an LO tuning signal configured to tune the frequency of the LO signal.

6. The receiver of claim 5, wherein power estimation component is configured to operate in an analysis phase, wherein the control unit dynamically tunes the frequency of the LO signal to the first LO frequency and the second LO frequency, and the measuring unit is configured to measure the power of the first blocker IF signal generated based on the first LO frequency and the second blocker IF signal generated based on the second LO frequency, respectively.

7. The receiver of claim 6, wherein power estimation component is further configured to operate in a setup phase, wherein the control unit generates the LO tuning signal configured to tune the frequency of the LO signal to the first LO frequency, the second LO frequency or the third LO frequency, based on a comparison of the measured power of the first blocker IF signal and the second blocker IF signal, measured during the analysis phase.

8. The receiver of claim 1, wherein both the first intermediate frequency and the second intermediate frequency are equal to the intermediate frequency and wherein the second intermediate frequency is a mirror image of the first intermediate frequency with respect to zero.

9. The receiver of claim 1, further comprises an analog to digital converter (ADC) downstream of the first mixer component configured to digitize the IF signal, prior to providing the IF signal to the second mixer component.

10. The receiver of claim 1, wherein the second mixer component further comprises a first mixer configured to tune the wanted IF signal and a second mixer configured to tune the blocker IF signal.

11. The receiver of claim 10, wherein the power estimation component is further configured to provide the tuning signal comprising a first tuning signal to tune the first mixer and a second tuning signal to tune the second mixer.

12. The receiver of claim 11, wherein the power estimation component is further configured to dynamically adjust the first tuning signal and the second tuning signal based on the measured power of the blocker IF signal.

13. The receiver of claim 1, wherein the first mixer component comprises a first input configured to receive the wanted RF signal and the blocker RF signal, a second input configured to receive the LO signal and an output configured to generate the IF signal based on the wanted RF signal, the blocker RF signal and the LO signal.

14. The receiver of claim 1, wherein the power estimation component is configured to perform the measurement of the power of the blocker IF signal at predetermined intervals.

15. The receiver of claim 1, wherein the frequency of the LO signal is in the range of bandwidth divided by two of the wanted RF signal from the frequency of the wanted RF signal.

16. The receiver of claim 1, wherein the first mixer component comprises an I-Q demodulator.

17. A method for dynamically adjusting the injection side in a Low IF receiver operating at an intermediate frequency, comprising:
   receiving a receive signal comprising a wanted RF signal at an RF frequency and a blocker RF signal at a mirror image frequency of the wanted RF signal with respect to a frequency of an local oscillator (LO) signal;
   down converting the wanted RF signal and the blocker RF signal to an intermediate frequency (IF) signal, at a first mixer component, based on the frequency of the LO signal, wherein the intermediate frequency signal comprises a wanted IF signal at a first intermediate frequency and a blocker IF signal at a second intermediate frequency;
   separating the wanted IF signal and the blocker IF signal from the IF signal at a second mixer component, based on a tuning signal;
   estimating a power of the blocker IF signal at a power estimation component; and
   selecting the frequency of the LO signal from a plurality of LO frequencies, based on the estimated power of the blocker IF signal.

18. The method of claim 17, wherein estimating the power of the blocker IF signal comprises:
   estimating the power of a first blocker IF signal generated based on the first LO frequency and a second blocker signal generated based on the second LO frequency; and
   comparing the power of the first blocker IF signal and the second blocker IF signal;
   wherein the first offset frequency comprises a frequency less than the frequency of the wanted RF signal, at a difference of the intermediate frequency from the wanted RF signal and the second offset frequency comprises a frequency greater than the frequency of the wanted RF signal, at a difference of the intermediate frequency from the wanted RF signal.

19. The method of claim 18, wherein selecting the frequency of the LO signal from a plurality of LO frequencies comprises tuning the frequency of the LO signal to the first LO frequency when the estimated power of the first blocker IF signal is weaker than the estimated power of the second blocker IF signal, and tuning the frequency of the LO signal to the second LO frequency when the estimated power of the second blocker IF signal is weaker than the estimated power of the first blocker IF signal.

20. The method of claim 19, wherein selecting the frequency of the LO signal from a plurality of LO frequencies, further comprises tuning the frequency of the LO signal to a third LO frequency when the estimated power of both the first blocker IF signal and the second blocker IF signal are greater than a predetermined threshold power, wherein the third LO frequency comprises a frequency equal to the center frequency of the wanted RF signal.

21. The method of claim 17, wherein the tuning signal for separating the wanted IF signal and the blocker IF signal from the IF signal is generated based on the estimated power of the blocker IF signal at the power estimation component.

22. The method of claim 17, wherein estimating the power of the blocker signal is performed at predetermined intervals.

23. A non-transitory medium on which a computer program having a program code, for performing, when the computer program is executed on a computer or on a processor, a method for dynamically adjusting the injection side in a Low IF receiver, comprising:
   receiving a receive signal comprising a wanted RF signal at an RF frequency and a blocker RF signal at a mirror image frequency of the wanted RF signal with respect to a frequency of an local oscillator (LO) signal;
   down converting the wanted RF signal and the blocker RF signal to an intermediate frequency (IF) signal, at a first mixer component, based on the frequency of the LO signal, wherein the intermediate frequency signal comprises a wanted IF signal at a first intermediate frequency and a blocker IF signal at a second intermediate frequency;
   separating the wanted IF signal and the blocker IF signal from the IF signal at a second mixer component, based on a tuning signal;
   estimating a power of the blocker IF signal at a power estimation component; and
   selecting the frequency of the LO signal from a plurality of LO frequencies, based on the estimated power of the blocker IF signal.

* * * * *